(12) United States Patent
Shum et al.

(10) Patent No.: US 9,418,864 B2
(45) Date of Patent: Aug. 16, 2016

(54) METHOD OF FORMING A NON VOLATILE MEMORY DEVICE USING WET ETCHING

(75) Inventors: Danny Pak-Chum Shum, Poughkeepsie, NY (US); Alfred Vater, Dresden (DE); John Power, Dresden (DE); Wolfram Langheinrich, Dresden (DE); Ulrike Bewersdorff-Sarlette, Radebeul (DE)

(73) Assignee: Infineon Technologies AG, Neubiberg (DE)

( * ) Notice: Subject to any disclaimer, the term of this patent is extended or adjusted under 35 U.S.C. 154(b) by 1435 days.

(21) Appl. No.: 12/022,949

(22) Filed: Jan. 30, 2008

(65) Prior Publication Data

US 2009/0189280 A1   Jul. 30, 2009

(51) Int. Cl.
| | |
|---|---|
| *H01L 21/336* | (2006.01) |
| *H01L 21/302* | (2006.01) |
| *H01L 21/461* | (2006.01) |
| *H01L 21/76* | (2006.01) |
| *H01L 21/8238* | (2006.01) |
| *H01L 27/108* | (2006.01) |
| *H01L 21/311* | (2006.01) |
| *H01L 27/105* | (2006.01) |
| *H01L 27/115* | (2006.01) |

(52) U.S. Cl.
CPC ........ *H01L 21/31111* (2013.01); *H01L 27/105* (2013.01); *H01L 27/11526* (2013.01); *H01L 27/11531* (2013.01); *H01L 27/11573* (2013.01)

(58) Field of Classification Search
CPC ............ H01L 27/105; H01L 27/11526; H01L 27/11531; H01L 27/11573
USPC .......................................... 438/709, 689, 593
See application file for complete search history.

(56) References Cited

U.S. PATENT DOCUMENTS

| | | | |
|---|---|---|---|
| 3,466,456 A | 9/1969 | Tolworthy | |
| 5,518,624 A * | 5/1996 | Filson et al. | .................. 210/651 |
| 5,837,594 A | 11/1998 | Honma et al. | |
| 6,764,898 B1 | 7/2004 | En et al. | |
| 7,037,787 B2 * | 5/2006 | Fan et al. | ....................... 438/267 |
| 7,126,315 B2 | 10/2006 | Seo | |
| 7,808,125 B1 | 10/2010 | Sachdeva et al. | |
| 9,143,056 B2 | 9/2015 | Ilic et al. | |
| 2003/0148625 A1* | 8/2003 | Ho et al. | ....................... 438/745 |
| 2004/0040501 A1 | 3/2004 | Vaartstra | |

(Continued)

FOREIGN PATENT DOCUMENTS

| | | |
|---|---|---|
| CA | 2702392 A1 | 4/2009 |
| DE | 202010007961 U1 | 10/2010 |

(Continued)

OTHER PUBLICATIONS

W.R. Runyan, Semiconductor Integrated Circuit Processing Technology, pp. 102-103 and 267, Addison-Wesley Publishing Company.

(Continued)

*Primary Examiner* — Kimberly Rizkallah
*Assistant Examiner* — Brian Turner
(74) *Attorney, Agent, or Firm* — Slater Matsil, LLP (57) ABSTRACT

In one embodiment, a method of forming a semiconductor device is disclosed. A high-k dielectric is deposited of over a semiconductor body, and a portion of the high-k dielectric is wet etched an etchant selected from the group consisting of hot phos, piranha, and SC1.

52 Claims, 9 Drawing Sheets

(56) References Cited

U.S. PATENT DOCUMENTS

| | | | |
|---|---|---|---|
| 2004/0051134 | A1 | 3/2004 | Jang et al. |
| 2005/0064716 | A1* | 3/2005 | Lin et al. ................ 438/709 |
| 2006/0151324 | A1* | 7/2006 | Davies et al. ............ 204/484 |
| 2006/0281212 | A1* | 12/2006 | Moriceau et al. ........... 438/48 |
| 2006/0286785 | A1* | 12/2006 | Rogers et al. ............ 438/584 |
| 2007/0023822 | A1* | 2/2007 | Sung et al. ............... 257/316 |
| 2007/0197048 | A1* | 8/2007 | Sekine et al. ............ 438/785 |
| 2007/0224813 | A1* | 9/2007 | Shen et al. ............... 438/689 |
| 2007/0246752 | A1 | 10/2007 | Cheng et al. |
| 2007/0252191 | A1* | 11/2007 | Kim et al. ................ 257/315 |
| 2008/0003776 | A1* | 1/2008 | Takami et al. ............ 438/450 |
| 2008/0303503 | A1 | 12/2008 | Wolfs |
| 2008/0315310 | A1* | 12/2008 | Rachmady et al. ........ 257/347 |
| 2009/0023259 | A1 | 1/2009 | Shum et al. |
| 2009/0212629 | A1 | 8/2009 | Paull |
| 2009/0284232 | A1 | 11/2009 | Zhang et al. |
| 2010/0195361 | A1 | 8/2010 | Stem |
| 2011/0058396 | A1 | 3/2011 | Oppermann |
| 2011/0140535 | A1 | 6/2011 | Choi et al. |
| 2011/0242857 | A1 | 10/2011 | Kim et al. |
| 2011/0285375 | A1 | 11/2011 | Deboy |
| 2012/0087157 | A1 | 4/2012 | Huang et al. |
| 2012/0175964 | A1 | 7/2012 | Yoscovich et al. |
| 2012/0300515 | A1 | 11/2012 | Carletti et al. |
| 2013/0155735 | A1 | 6/2013 | Ilic et al. |

FOREIGN PATENT DOCUMENTS

| | | |
|---|---|---|
| EP | 2477318 A2 | 7/2012 |
| GB | 2483317 A | 3/2012 |
| WO | 2007082753 A2 | 7/2007 |
| WO | 2009105678 A2 | 8/2009 |
| WO | 2012016285 A1 | 2/2012 |
| WO | 2013030236 A2 | 3/2013 |

OTHER PUBLICATIONS

Alonso, O., et al., "Cascaded H-Bridge Multilevel Converter for Grid Connected Photovoltaic Generators with Independent Maximum Power Point Tracking of each Solar Array," IEEE 34th Annual Power Electronics Specialist Conference (PESC '03), vol. 2, Jun. 15-19, 2003, pp. 731-735.

Ertl, H., et al., "A Novel Multicell DC-AC Converter for Applications in Renewable Energy Systems," IEEE Transactions on Industrial Electronics, vol. 49, No. 5, Oct. 2002, pp. 1048-1057.

Johnson, B., et al., "Photovoltaic AC Module Composed of a Very Large Number of Interleaved Inverters," Twenty-Sixth Annual IEEE Applied Power Electronics Conference and Exposition (APEC), Mar. 6-11, 2011, pp. 976-981, Fort Worth, Texas.

Mekhilef, S, et al., "Implementation of Grid-Connected Photovoltaic System with Power Factor Control and Islanding Detection," 35th Annual IEEE Power Electronics Specialists Conference, Jun. 20-25, 2004, pp. 1409-1412.

Ranade, S.J., et al., "A Study of Islanding in Utility-Connected Residential Photovoltaic Systems," IEEE Transactions on Energy Conversion, vol. 4, No. 3, Sep. 1989, pp. 436-445.

Sahan, B., "Wechselrichtersysteme mit Stromzwischenkreis zur Netzanbindung von PV-Generatoren," ISBN 978-3-89958-912-2, 2010, 10 pages.

Walker, G., et al., "Cascaded DC-DC Converter Connection of Photovoltaic Modules," IEEE Transactions on Power Electronics, vol. 19, No. 4, Jul. 2004, pp. 1130-1139.

* cited by examiner

METHOD OF FORMING A NON VOLATILE MEMORY DEVICE USING WET ETCHING

TECHNICAL FIELD

The invention is related to a semiconductor structure and a method of producing the semiconductor structure. In particular embodiments, the invention is directed to the formation of a flash memory device structure with improved performance and a method for fabricating the same.

BACKGROUND

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

One type of semiconductor device is a memory device, in which data is typically stored as a logical "1" or "0." A memory device may be static or dynamic. A dynamic memory device needs to be refreshed to "remember" the data, whereas a static memory device does not need to be refreshed to retain stored data.

One type of static memory device, also referred to in the art as a non-volatile memory (NVM) device, is a floating gate memory device. A floating gate memory device can be either erasable programmable read-only memory (EPROM) or electrically erasable programmable read-only memory (EEPROM). Both types of floating gate memories rely on a charge stored in the floating gate (or a charge trap layer) by suitable application of a bias to the various terminals of the device. The charge may be stored by a number of mechanisms such as carrier tunneling and/or injection. The charge may be removed either electrically as in EEPROM devices or by an external source such as an ultra violet light. The presence of this charge in the floating gate determines the state of the memory as logical "1" or "0." Flash EEPROM memories are called such due to their fast program and erase times (as in a lightning flash).

As semiconductor device geometries get smaller and smaller, however, the fabrication of non-volatile memory devices becomes more challenging. In order to maintain long-term charge storage and data retention using state-of-the art semiconductor processes, thicker inter-poly oxides may be required. The combination of these thicker oxides and smaller device areas have potentially decreased capacitive coupling between the control gate and the floating gate within the memory device which requires higher programming voltages to be developed on-chip. Unfortunately, higher programming voltages increase power consumption and may exceed voltage levels that high density logic devices are able to sustain in fine geometry processes.

One possible solution to the problems associated with using thicker oxides is to employ the use of high-k dielectric materials. These high-k materials, however, are difficult to etch and require additional fabrication process steps to ensure their successful use. What is needed are better methods and processes for patterning and etching high-k dielectric materials.

SUMMARY OF THE INVENTION

In one embodiment, a method of forming a semiconductor device is disclosed. A high-k dielectric is deposited over a semiconductor body, and a portion of the high-k dielectric is wet etched by an etchant selected from the group consisting of hot phos, piranha, and SC1.

The foregoing has outlined, rather broadly, embodiments of the present invention. Additional embodiments of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely improved methods for etching high-k materials used in non-volatile memory devices having a floating gate or charge trap layer, and in capacitors. Concepts of the invention can also be applied, however, to other electronic devices, such as standard logic devices, or other semiconductor structures requiring high-k materials. Similarly, although the invention is disclosed for a planar MOS device, the invention can also be applied to other devices such as MUGFETs (e.g. double gate devices and triple gate devices), FinFETs, and other devices.

Device scaling is essential for the continued success of any technology including flash memories. Device scaling enables formation of more devices per area while improving and/or maintaining key electrical metrics such as program, erase, retention, and read times. This translates into improved product performance at lower cost, thus enabling increased production and sales. This typically involves scaling device geometries (such as channel length) to enable operation at, for example, lower power, lower voltages, etc.

Unlike CMOS devices, flash devices have another limitation imposed by the retention time of the trapped charge in the floating gate (or charge trap layer). Ideally, a flash memory cell constrains a trapped charge forever. However, in reality, the trapped charge can tunnel back into the semiconductor channel or control gate during the "off" state of the device which results in the loss of stored information. Flash devices sold on the market are typically expected to store information for at least 10 years, thereby imposing a lower limit on the thickness of the tunnel oxide. Hence, the tunnel oxides in flash devices are at least 6 nm thick and typically around 8 nm to 10 nm. A thicker gate stack dielectric requires a higher operating voltage to ensure reliable program and erase operations. A higher operating voltage (especially on the drain or source side) combined with a thicker dielectric reduces gate control of the channel, which creates excessive short channel effects. These short channel effects prevents channel length scaling due to an increase in unwanted leakage currents. Furthermore, higher operating voltages require larger select gate transistors, again reducing device density.

One way of overcoming this barrier is by replacing the gate dielectric stack with a higher-k dielectric material. The increase in the dielectric permittivity increases the gate control of the device by improving the capacitive coupling of the control gate on the channel of the device. This enables the use of a lower operating voltage without compromising the retention time of the device, therefore enabling channel length scaling. For example, a voltage of between about 9V and about 11V is typically required at the floating gate node (1025 in FIG. 1*a*) in a non-volatile memory device. Because of capacitive division effects through the inter-poly dielectric, a higher programming voltage must be used to maintain the required voltage at the control gate node (1026 in FIG. 1*a*). Typically, this higher programming voltage is between 18V and about 22V. For example, if 10V is required at the floating gate node, and a coupling ratio of 50% exists, (which is typical with non high-k dielectric) a higher programming voltage of about 20V would need to be developed. If, however, a high-k dielectric is used, coupling ratios of about 70% may be achieved and a high programming voltage of 14V may be all that is necessary to ensure successful programming. The use of high-k dielectrics, therefore, reduces the maximum charge pump voltage required in a system because of more efficient capacitive coupling during programming due to the increased relative capacitance offered by high-k dielectrics.

The use of high-k dielectrics enables the effective thickness of the gate stack to be decreased without decreasing the physical thickness (hence charge retention) of the gate dielectric. Hence, the decrease in effective thickness of the gate stack enables channel length scaling, while maintaining the retention time of carriers. By using high-k dielectrics, channel lengths can be made shorter, thereby permitting higher device densities.

The introduction of high-k materials into a semiconductor process flow creates process and integration challenges. One of the challenges associated with the introduction of high-k dielectric materials relates to their removal from unwanted regions of the wafer. For example, the deposited high-k dielectric material may be required to be removed from logic areas, source areas, drain areas, contact areas, etc. This requires removal of the high-k dielectric material without removing additional material underneath the high-k material layer. To accomplish this, an etchant should preferably have a faster etch rate for the high-k dielectric than for the underlying material. However, typical etches used in conventional processing are not selective to high-k dielectric materials. For example, standard wet etch processes may not be able to remove high-k layers as they tend to recrystallize the high-k material during the etching process. Similarly, conventional reactive ion etch (RIE) processes may not have adequate control and may cause the removal of silicon or oxide below the high-k layer. Further, even if such processes exist, they may not be compatible with existing equipment or process flows.

Other solutions have proposed damaging the high-k layer to using an RIE plasma treatment followed by a wet chemical etch to remove the damaged high-k material. Damaging high-k material followed by a subsequent removal is problematic because of a very narrow process window.

In various aspects, the invention addresses the problem of creating devices with high-k gate dielectrics in modern microelectronic devices. The invention is particularly applied to flash memory devices.

Embodiments of the present invention disclose a method for selectively removing high-k materials using existing equipment. In one embodiment of the present invention, high-k materials are selectively removed using a wet etch containing $H_3PO_4$ (hot phos). Since $H_3PO_4$ does not attack other $SiO_2$ based oxide layers or the silicon surface, regions that must be protected from the etchant, such as sidewalls of a gate stack, can be protected by the deposition of an oxide liner. In alternative embodiments, etchants such as $NH_4OH$ and $H_2O_2$ (SC1), and $H_2SO_4$ and $H_2O_2$ (Piranha), can be used in place of hot phos.

Figure 1A:
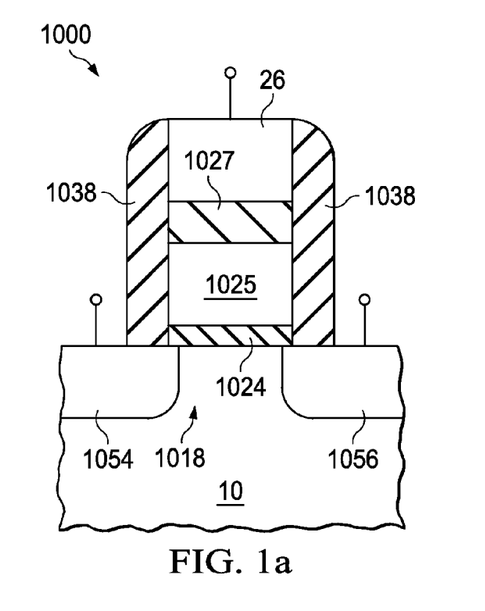
FIGS. 1a-1c illustrate cross sections of devices fabricated by embodiment methods.
Figure 1B:
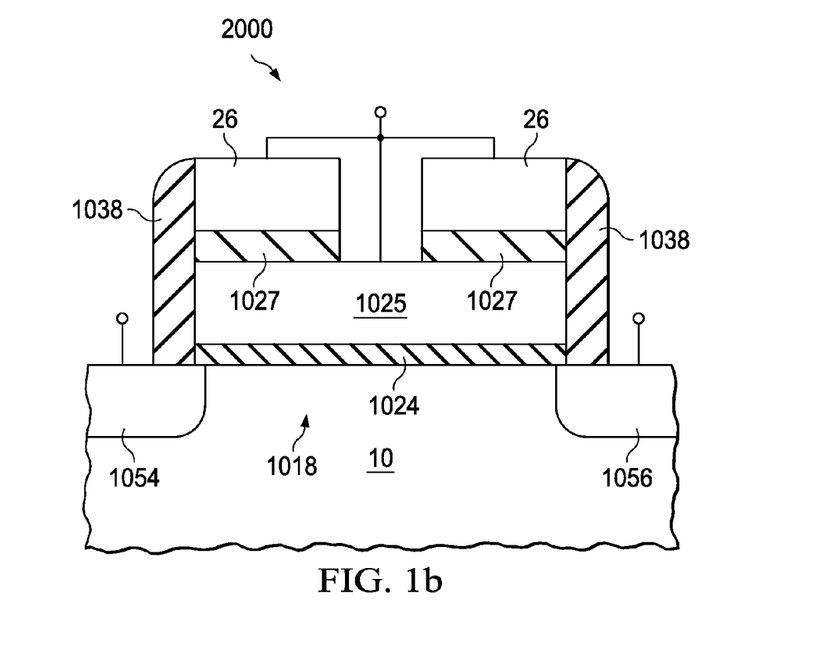
Figure 1C:
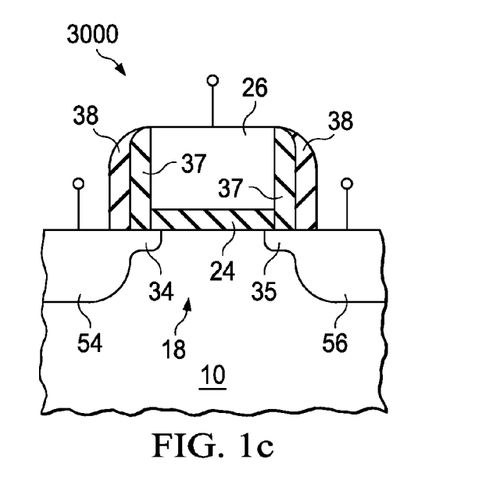
Figure 2A:
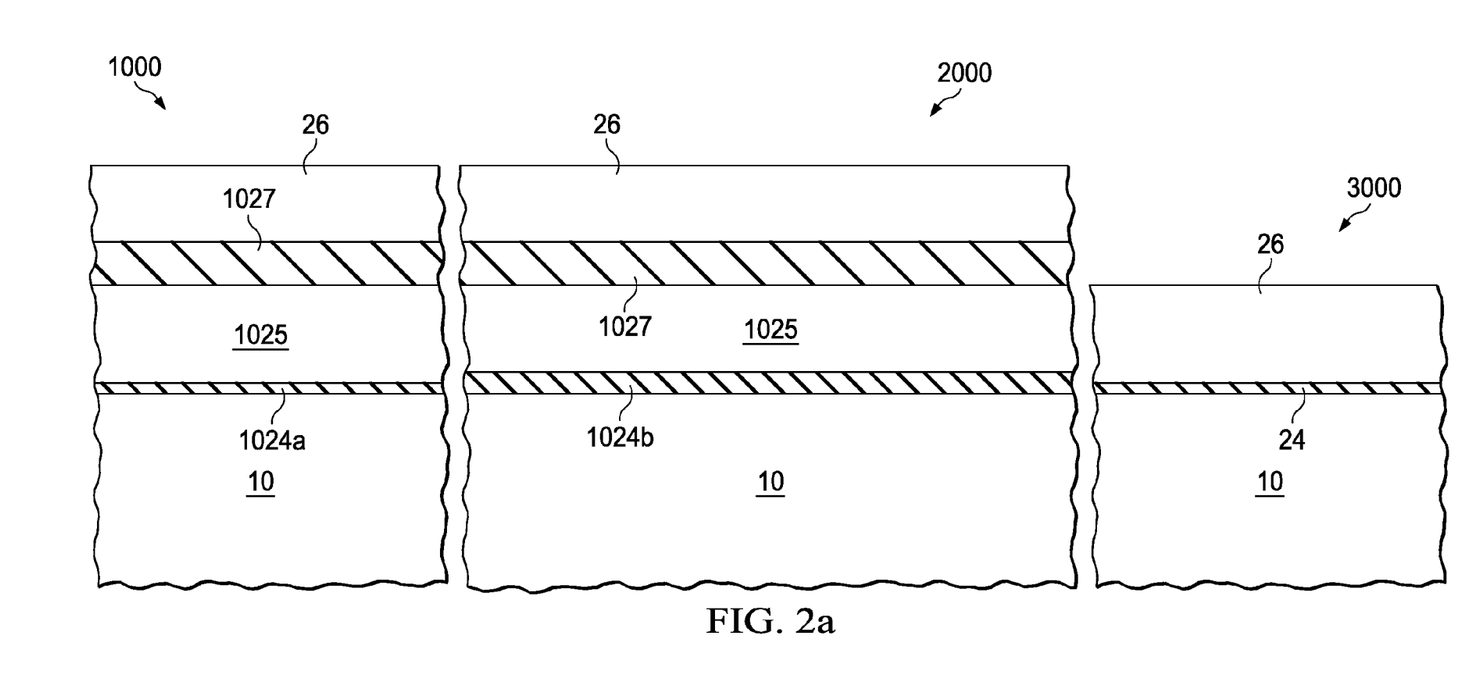
FIGS. 2a-2e illustrate cross sections of an embodiment process.
Figure 2B:
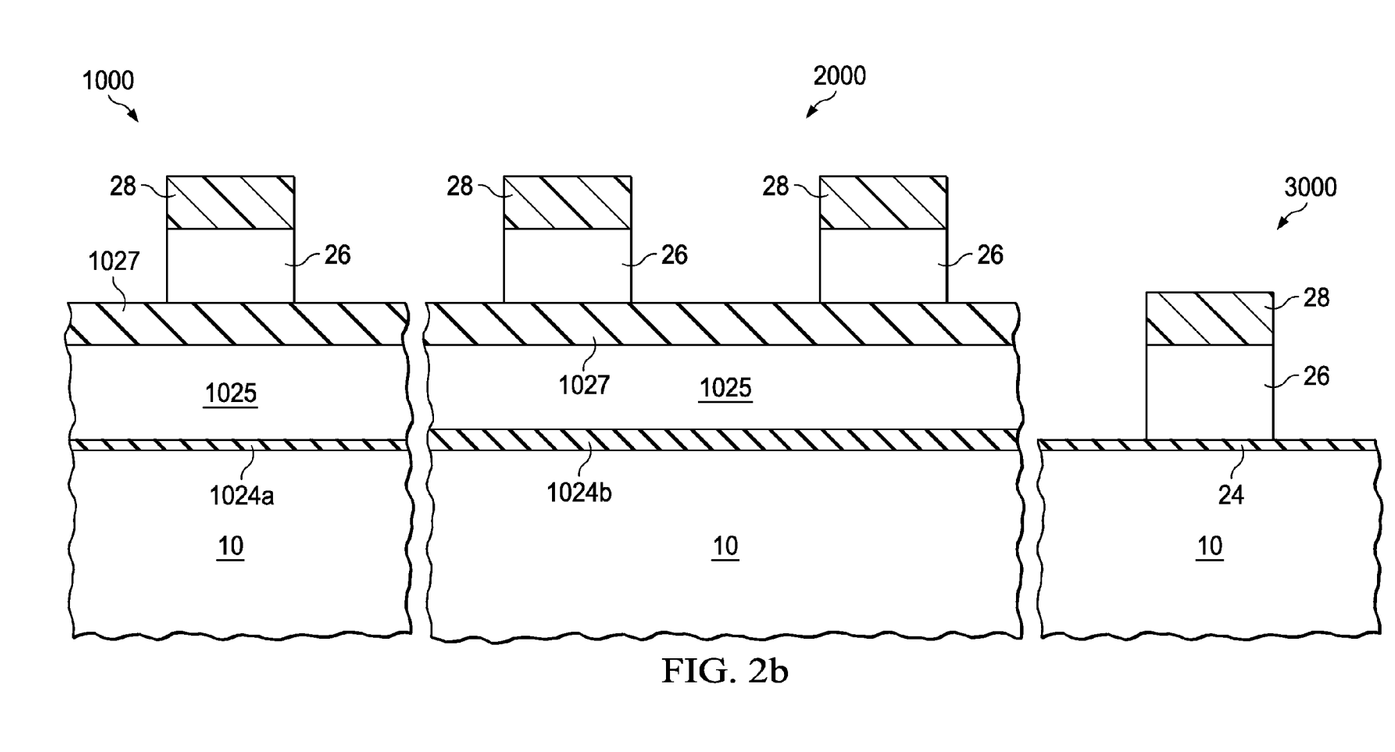
Figure 2C:
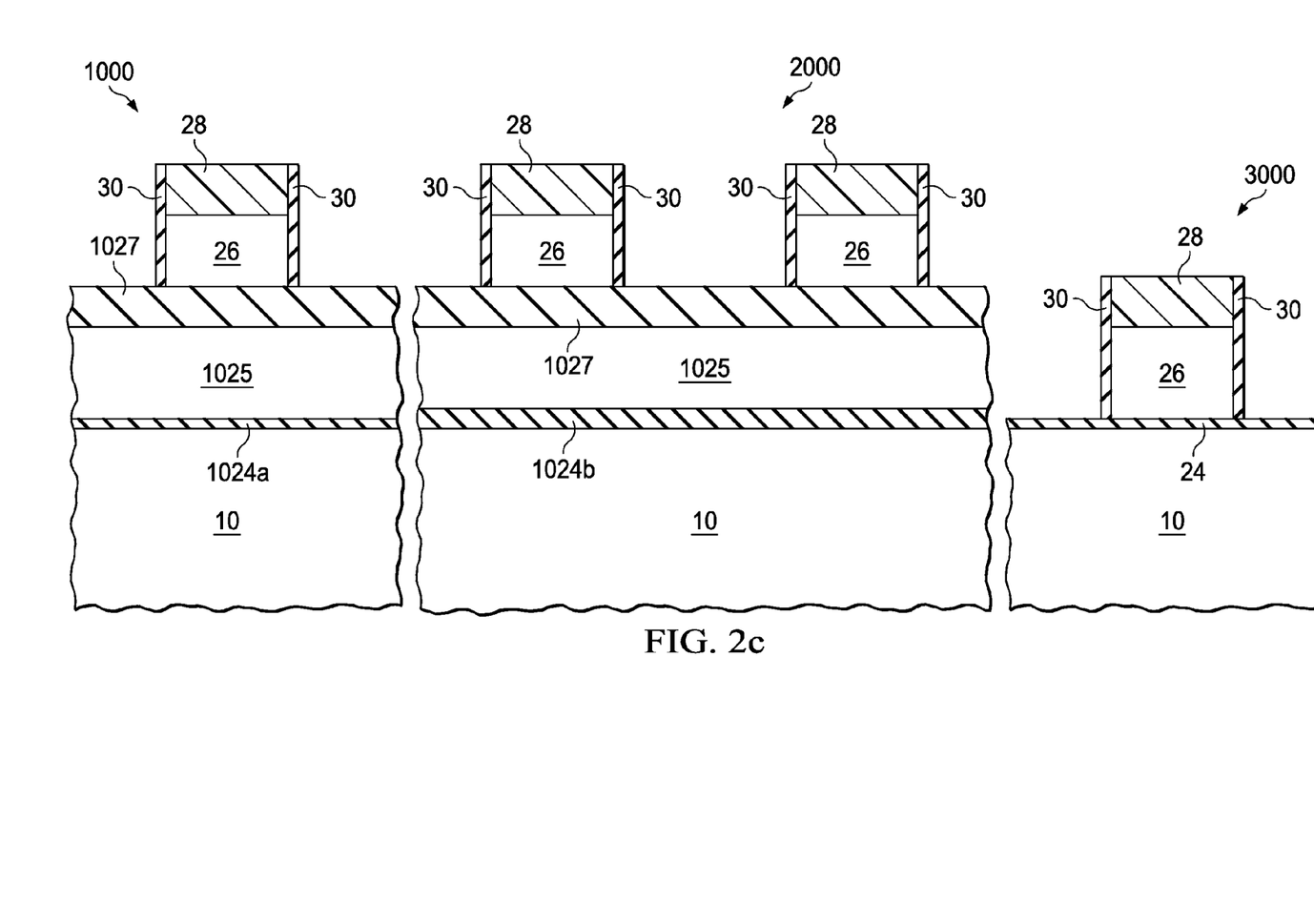
Figure 2D:
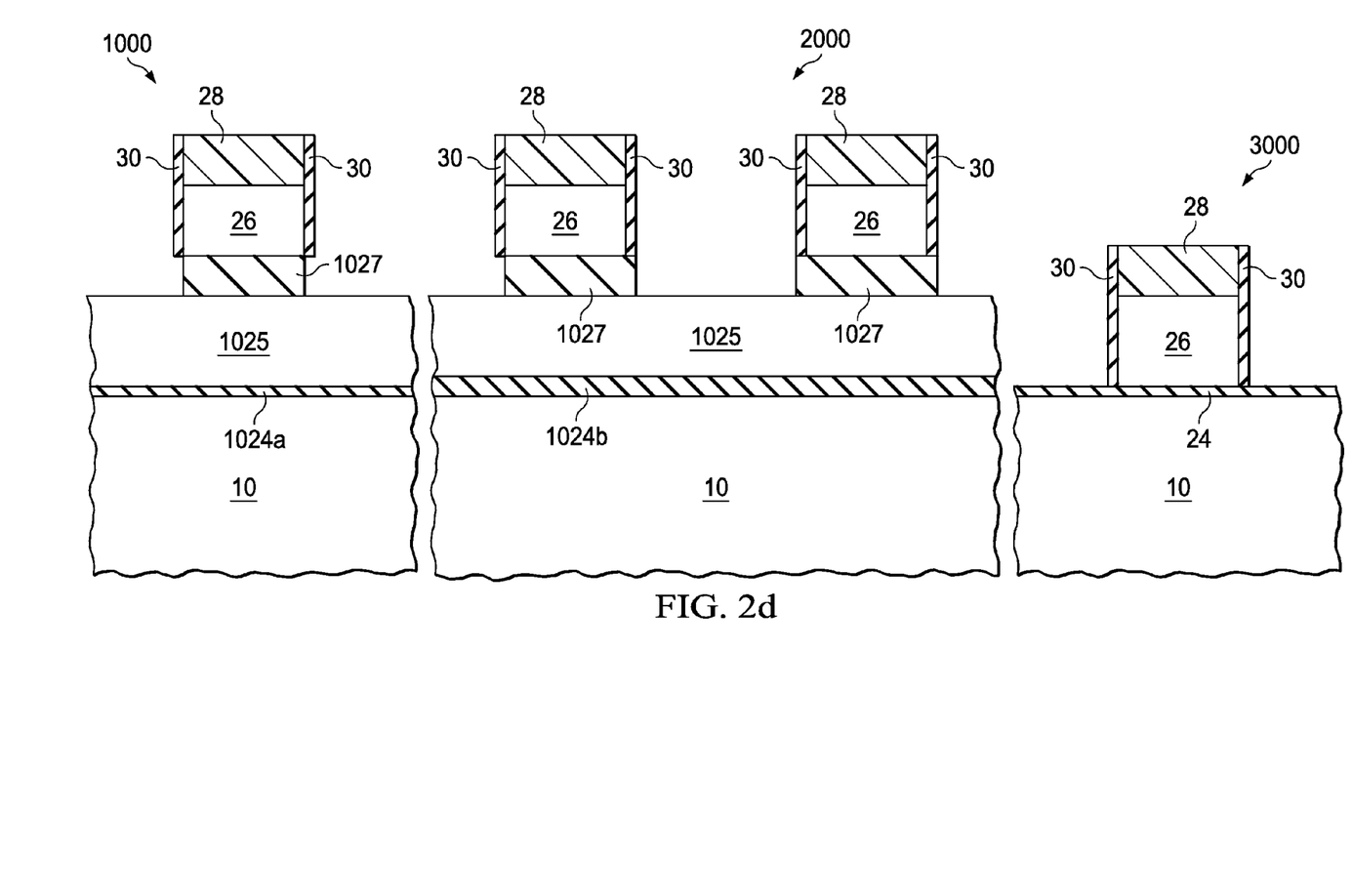
Figure 2E:
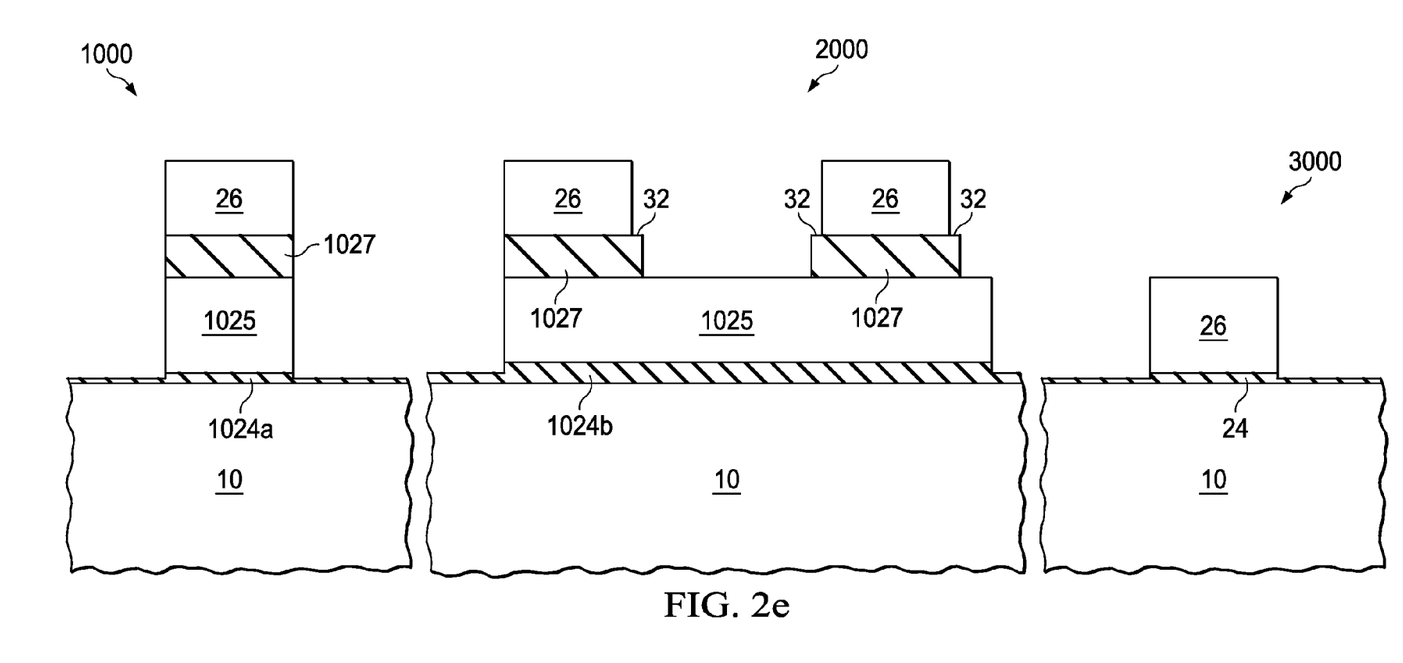
Figure 3:
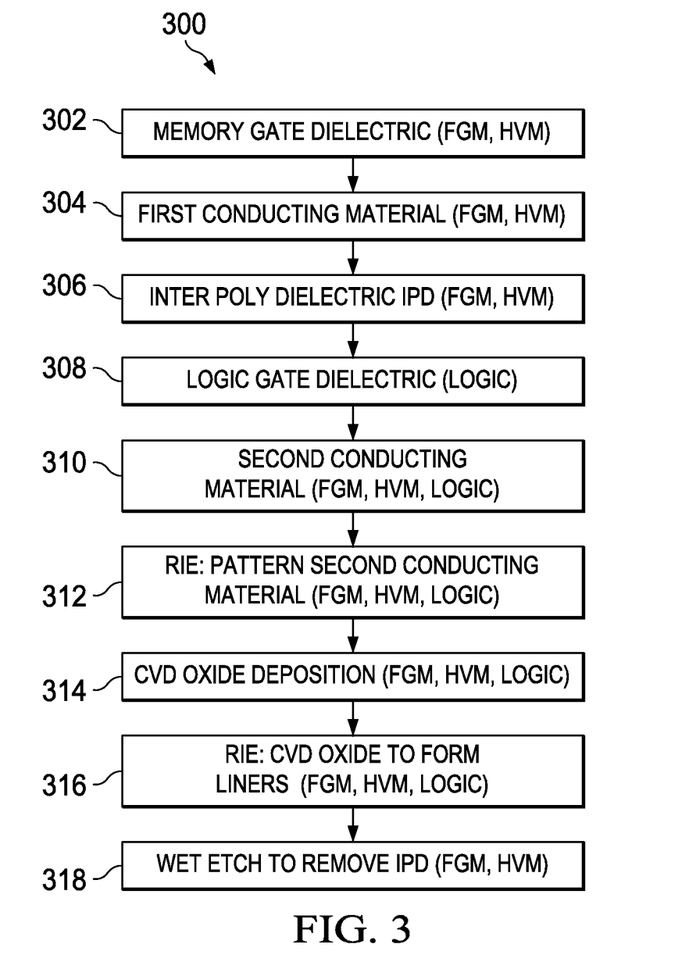
FIG. 3 illustrates a flow diagram of an embodiment process.
Figure 4A:
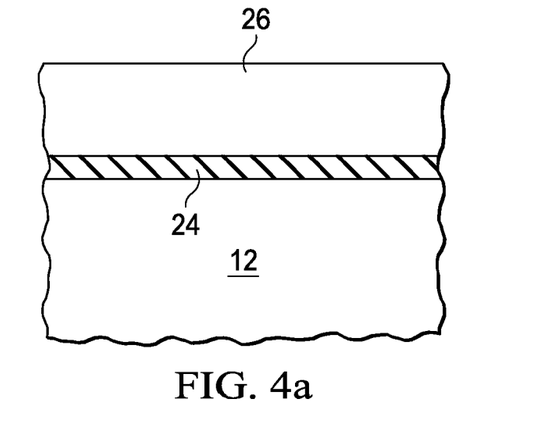
FIGS. 4a-4c illustrate a cross sections of capacitors fabricated according to an embodiment process.
Figure 4B:
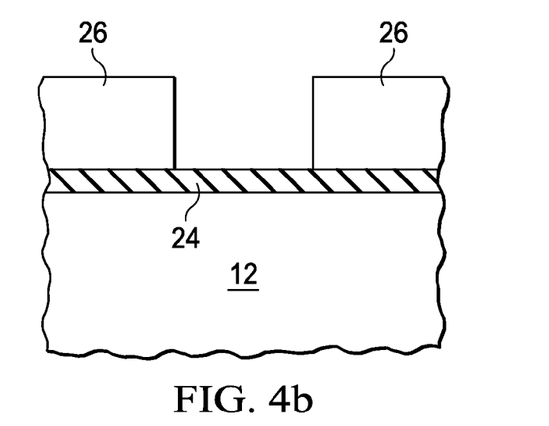
Figure 4C:
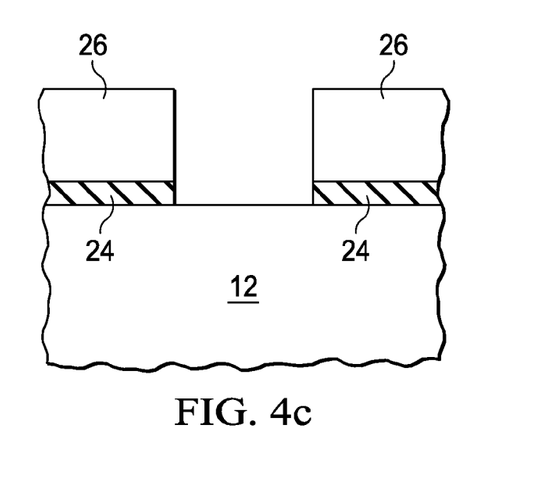
Figure 5:
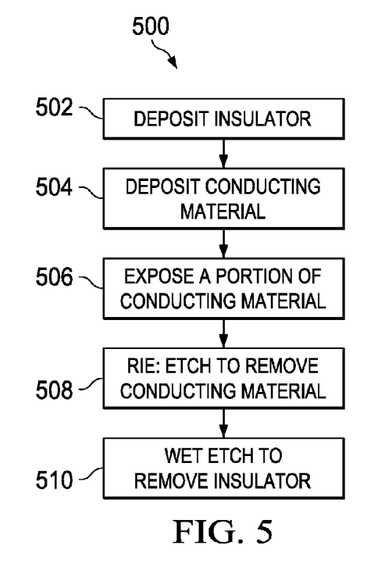
FIG. 5 illustrates a flow diagram for fabricating capacitors according to an embodiment process.

An exemplary transistor device is shown in FIG. 1 and various methods for the formation of transistor devices using these concepts will then be described with respect to the cross-sectional views of FIGS. 2*a*-2*e* and FIG. 4*a*-4*c*, FIGS. 6*a*-7*d*, and the flow charts of FIGS. 3 and 5.

FIGS. 1*a*-1*c* illustrate the typical memory and CMOS devices formed with a preferred embodiment of the current invention: FIG. 1*a* represents a floating gate flash memory device; FIG. 1*b* represents a dual poly shorted select gate transistor or a HV logic device with a thicker gate dielectric; and FIG. 1*c* represents a logic device fabricated on the same substrate as embodiments of the present invention.

Referring now to FIG. 1*a*, channel 1018, source 1054, and drain 1056 are disposed in a semiconductor body (or substrate) 10. A gate insulator 1024 is disposed over the channel 1018. A gate stack including floating gate 1025, inter-poly dielectric 1027, and control gate 26 are disposed over gate insulator 1024 to form floating gate memory device 1000. Spacers 1038 cover the exposed electrodes along the sides to prevent control gate 26 and floating gate 1025 from shorting together.

Referring now to FIG. 1*b*, channel 1018, source 1054, and drain 1056 are disposed in a semiconductor body 10. A gate insulator 1024 is disposed over the channel 1018. A gate stack including floating gate 1025, inter-poly dielectric 1027, and control gate 26 are disposed over the gate insulator 1024. Floating gate 1025 and control gate 26 are shorted to form a field effect transistor 2000 used in memory cells. In an alternative embodiment of the present invention, a high voltage (HV) dual poly shorted transistor can be formed by adding a mask and replacing gate insulator 1024 of FIG. 1*b* by a thicker gate dielectric 1024. The gate dielectric 1024 of the dual poly shorted field effect transistor may be thicker than the floating gate transistor shown in FIG. 1a. Gate dielectric 1024 is preferably about 20 nm to sustain the high voltages necessary to operate flash memory cells. Since inter-poly dielectric 1027 separates floating gate 1025 and control gate 26, it may also be referred to as an inter-metal dielectric.

A logic device formed using the current embodiment is shown in FIG. 1c. Channel 18, source 54, drain 56, and source/drain extension 34 and 35 are disposed in a semiconductor body 10. Gate insulator 24 is disposed over the channel 18. A gate 26 is disposed over the gate insulator 24 forming a logic field effect transistor 3000.

A preferred embodiment process flow will now be discussed for fabricating the floating gate devices 1000 and 2000. As one advantageous feature, this process flow can be used to simultaneously form both logic and memory devices. The memory regions may either be regions where floating gate memory (FGM) devices are formed or regions where high voltage memory (HVM) devices are formed. The HVM devices support the operation of the floating gate memory devices such as select gate transistors. These HVM devices typically comprise shorted dual poly MOS transistors. Logic regions can be either high voltage logic (HVL) or low voltage logic (LVL) devices. High voltage logic devices typically operate at voltages over a certain level (e.g., 3V), whereas low voltage logic devices operate at voltages below that level. For example, input/output transistors that interface with peripheral or outside circuits typically operate at higher operating voltages. Similarly, the logic transistors that constitute the bulk of devices for a given technology are typically low voltage devices. In a typical CMOS flow, all the four device regions FGM, HVM, LVL and HVL are fabricated on the same die using known masking techniques to selectively expose certain regions of the wafer.

FIGS. 2a-2f illustrate the formation of devices in the FGM 1000, HVM 2000, and LVL 3000 regions of the wafer. Referring first to FIG. 2a, a semiconductor body 10 is provided. In a preferred embodiment of the present invention, the semiconductor body 10 is a silicon wafer. Semiconductor body 10 can be a bulk mono-crystalline silicon substrate (or a layer grown thereon or otherwise formed therein), a layer of (110) silicon on a (100) silicon wafer, a silicon-on-insulator (SOI) wafer, or a germanium-on-insulator (GeOI) wafer. In other embodiments, other semiconductors such as silicon germanium, germanium, gallium arsenide, indium arsenide, indium gallium arsenide, indium antimonide or others can be used.

In a preferred embodiment of the present invention, isolation trenches (not shown) are formed in the semiconductor body 10. Isolation trenches can be formed using conventional techniques. The trenches are filled with an isolating material such as an oxide. These trenches define active areas, in which integrated circuit components can be formed. The depth of trench regions may be different for high voltage devices and low voltage devices. For example, memory and high voltage devices may be isolated with deep trench isolation, whereas the low voltage devices may be isolated with shallow trench isolation. Alternatively, these devices may all be isolated by one type of isolation in order to reduce cost and/or process complexity.

As shown in FIG. 2a, a gate stack is formed over the FGM 1000, HVM 2000, and Logic 3000 regions. Different gate dielectrics can be grown on the semiconductor body using well known masking steps. In a preferred process, gate dielectric 1024b of HVM transistor 2000 is formed first, followed by gate dielectric 1024a of the floating gate memory FGM device 1000. These gate dielectrics 1024a and 1024b function as a tunnel oxide for floating gate devices FGM 1000 and HVM 2000. Gate dielectric 1024b of HVM transistor 2000 is preferably thicker than gate dielectric 1024a of the FGM device to support higher voltages. Gate dielectric 1024b of HVM transistor 2000 preferably comprises a thickness of between about 150 Å to about 250 Å, preferably about 200 Å. Alternatively, gate dielectric 1024b of HVM transistor 2000 may comprise other dimensions. Gate dielectric 1024a and 1024b is deposited over exposed portions of semiconductor body 10. Preferably gate dielectric 1024a of FGM transistor 1000 is an oxide layer about 90 Å thick. Gate dielectric 1024a of the FGM transistor 1000 preferably comprises a thickness of about 30 Å to about 150 Å in one embodiment, although alternatively, the gate dielectric 1024a of the FGM transistor 1000 may comprise other dimensions.

In an alternative embodiment, gate dielectric 1024a and/or 1024b may comprise a nitride (e.g., $Si_3N_4$), or a combination of an oxide and a nitride (e.g., SiON, or an oxide-nitride-oxide sequence). In other embodiments, a high-k dielectric material having a dielectric constant of about 5.0 or greater may be used as gate dielectric 1024a and/or 1024b. Suitable high-k materials include $HfO_2$, $HfSiO_x$, $Al_2O_3$, $ZrO_2$, $ZrSiO_x$, $Ta_2O_5$, $La_2O_3$, nitrides thereof, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, combinations thereof, or combinations thereof with $SiO_2$, as examples. Alternatively, gate dielectric 1024a and/or 1024b can comprise other high-k insulating materials or other dielectric materials. Gate dielectric 1024a and/or 1024b may comprise a single layer of material, or alternatively, the gate dielectric 1024a and/or 1024b may comprise two or more layers.

Gate dielectric 1024a and/or 1024b may be grown by thermal oxidation, or deposited by chemical vapor deposition (CVD), atomic layer deposition (ALD), metal organic chemical vapor deposition (MOCVD), physical vapor deposition (PVD), or jet vapor deposition (JVD), as examples. Alternatively, gate dielectric 1024 may be deposited using other suitable deposition techniques.

In preferred embodiments of the present invention, the same dielectric layer can form gate dielectric 1024a and/or 1024b for both the p-channel/n-channel transistors of the high voltage memory device and the gate dielectric 1024 of the floating gate memory device. This feature is not however required. In alternate embodiments, gate dielectric 1024a and/or 1024b can be grown selectively in the floating gate memory areas. Similarly, in alternate embodiments, gate dielectric 1024a and/or 1024b can be grown along with either the p-channel transistors or the n-channel transistors.

A first conducting material is then deposited over the semiconductor wafer forming floating gate electrode 1025 over gate dielectric 1024a and 1024b. Floating gate electrode 1025 preferably comprises a semiconductor material, such as polysilicon or amorphous silicon. Alternatively, other semiconductor materials may be used for floating gate electrode 1025. In other embodiments, the floating gate electrode 1025 may comprise TiN, TiC, HfN, TaN, TaC, W, Al, Ru, RuTa, TaSiN, $NiSi_x$, $CoSi_x$, $TiSi_x$, Ir, Y, Pt, Ti, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, other metals, and/or combinations thereof, as examples. In one embodiment, the floating gate electrode 1025 comprises a doped polysilicon layer.

Floating gate electrode 1025 may comprise a plurality of stacked gate materials, such as a metal underlayer with a polysilicon cap layer disposed over the metal underlayer. Floating gate electrode 1025 preferably has a thickness of between about 400 Å to about 2000 Å, and may be deposited using CVD, PVD, ALD, or other deposition techniques. In other embodiments, different types of transistors can include gates of different materials and/or thicknesses.

If floating gate layer 1025 comprises polysilicon, it may be doped with a suitable n-type or p-type dopant. For example, an n-type gate electrode may be formed by a depositing phosphorus doped floating gate electrode. In some cases, the polysilicon layer may be doped by implanting a suitable dopant. Typically, n-type electrodes are doped in-situ during deposition by depositing doped polysilicon comprising phosphorus, arsenic, and/or antimony. Similarly, p-type electrodes may be formed by implanting atoms comprising boron and/or $BF_2$. In preferred embodiments, n-type polysilicon layers are deposited as floating gate layers 1025.

Inter-poly dielectric 1027 is then deposited over floating gate electrode 1025 in both the floating gate memory cell 1000 and high voltage memory 2000 areas. In preferred embodiments, inter-poly dielectric material 1027 is $Al_2O_3$. Other suitable high-k materials include $HfO_2$, $HfSiO_x$, $ZrO_2$, $ZrSiO_x$, $Ta_2O_5$, $La_2O_3$, nitrides thereof, $HfAlO_x$, $HfAlO_xN_{1-x-y}$, $ZrAlO_x$, $ZrAlO_xN_y$, $SiAlO_x$, $SiAlO_xN_{1-x-y}$, $HfAlSiO_x$, $HfAlSiO_xN_y$, $ZrSiAlO_x$, $ZrSiAlO_xN_y$, combinations thereof, or combinations thereof with $SiO_2$, as examples. To avoid charge trap levels near the floating gate interface, a thin oxide layer is typically deposited before the high-k deposition. In some embodiments, an additional oxide layer on top of the high-k layer may also be used.

Inter-poly dielectric 1027, first conducting material 1025, and gate dielectric 1024 are selectively removed from the logic areas 3000 and a suitable gate dielectric 24 is deposited. After the formation of all gate dielectric regions of all devices (for example, low voltage logic devices such as core $V_T$, low $V_T$, and high $V_T$ devices etc.), all regions (FGM 1000, HVM 2000, and Logic 3000) of the semiconductor body 10 are opened.

A second conducting material 26 is then deposited across the whole semiconductor wafer. Similar to the first conducting material, the second conducting material may comprise poly silicon or metallic layers. In a preferred embodiment, a second conducting material 26 is an undoped polysilicon layer which may be implanted with a suitable dopant, for example, an n-type dopant for NMOS devices and a p-type for PMOS devices. These implants may occur during later processing, typically during the source/drain implant steps. An anneal may be introduced to produce a uniform profile in the polysilicon layers and reduce traps and defects in the dielectric materials.

Turning to FIG. 2b, the gate stack layers are next patterned and etched using known photolithography techniques. First, hard mask 28 is deposited over the second conducting material 26. Hard mask 28 may include a nitride material such as silicon nitride, an oxide material such as silicon dioxide, a nitridized oxide, or multiple layers and combinations thereof, for example, although alternatively, hard mask 28 may comprise other materials. In some embodiments, hard mask 28 may be a trilayer including two nitride layers with an oxide layer disposed between the nitride layers. A plurality of alternating silicon dioxide layers and silicon nitride layers may be used for hard mask 28, to provide etch selectivity and etch stop layers for subsequent etch processes, for example. Hard mask 28 may prevent the formation of semiconductive material in subsequent processing steps over the second conducting material 26, for example. Hard mask 28 preferably comprises about 1000 Angstroms or less of silicon nitride and/or silicon dioxide, although alternatively, hard mask 28 may comprise other dimensions and materials.

A layer of photosensitive material (not shown) comprising a photoresist, for example, may be deposited over the hard mask 28. Preferably, a layer of anti-reflective coating (ARC) is deposited above or below the photosensitive material. The layer of photosensitive material is patterned with the desired pattern for the control gate 26, and the patterned layer of photosensitive material and optionally also the hard mask 28 are used as a mask to pattern the second conducting layer 26 and leaving the patterned hard mask 28 and control gate 26 as shown in FIG. 2b. In preferred embodiments of the present invention, second conducting material 26 is etched using a an RIE with high oxide selectivity to stop on layer 24 of device 3000 and inter-poly dielectric 1027 of devices 1000 and 2000. The layer of photosensitive material is then removed.

Reactive ion etching is a combination of physical and chemical etching. The physical nature of the RIE arises due to directional ion bombardment of the wafer surface. The ions are created by high electric fields produced between a top and a bottom electrode. The ions are energized by RF generators connected to these electrodes. The gas chemistry and hence the ionic and chemical nature of RIE is determined by the flow of gases into the RIE furnace.

The RIE process comprises a first break through step followed by a main etch. The break through process is typically performed to remove the thin layer of native oxide covering the second conducting material layer 26, which preferably comprises polysilicon. Since the oxide etch rate of the main etch is usually very low, the etch may be typically modified. This may be done, for example, by increasing the RF power or adding a suitable etchant to the plasma.

The main RIE follows the break through step. Chemistries based on bromine are amongst the most popular polysilicon etchants due to their high selectivity over oxides. For example, a typical component of the main etchant gas may be HBr at a pressure of between about 10 mT and about 60 mT. The main RIE etch may contain HBr at a flow rate of between about 200 sccm and about 600 sccm. The top and bottom electrodes may be at about 600 W and about 100 W. In a preferred embodiment, the RIE process comprises a total pressure of 20 mT, and the HBR flow rate of about 550 sccm.

Turning to FIG. 2c, liner 30 is deposited on the sidewalls of hard mask 28, second conductive layer 26, and on the remaining sidewalls of the gate stacks of devices 1000, 2000, and 3000. In preferred embodiments of the present invention, liner 30 is an oxide liner deposited using a standard CVD process to a depth of between about 5 nm and 50 nm, preferably between about 20 nm and 30 nm. In alternative embodiments of the present invention, other thicknesses can be used. Oxide liner 30 preferably consists of 20 nm, although other $SiO_2$ based materials can be used. In alternative embodiments of the present invention, ALD, MOCVD, HTO (high temperature deposited oxide), LTO (low temperature deposited oxide), SOG (spin-on glass), for example, can be used to form oxide liner 30.

After oxide 30 has been deposited, an anisotropic RIE process is used to remove oxide 30 from the top surface of inter-poly dielectric 1027 of devices 1000 and 2000, and silicon 10 of device 3000 as well on top of hard mask layer 28 using conventional oxide RIE techniques with timed etch to remove about 20 nm of deposited oxide. This oxide RIE process is well known to the industry. As shown in FIG. 2c, remaining oxide 30 on sidewalls of the gate stacks of devices 1000, 2000, and 3000 will protect these gate stacks from the etchants used to etch inter-poly dielectric 1027.

Turning to FIG. 2d, inter-poly dielectric 1027 is wet etched using hot phos. In preferred embodiments of the present invention, the etchant comprises between about 50% and about 90% $H_3PO_4$, preferably about 80%, and $H_2O$ at a temperature of between about 100° C. and about 200° C., preferably about 158° C. In preferred embodiments of the present invention, an etch time of about 150 seconds is required to remove between about 6 nm and 15 nm of high-k dielectric such as $Al_2O_3$. In alternative embodiments, however, other etch conditions may be necessary depending on the material and thickness of the high-k dielectric, chemical concentration and temperature of the etchant. It should be noted that oxide layer 30 is necessary to protect the sidewalls of inter-poly dielectric 1027 of devices 1000 and 2000 at the gate edge 26 from extensive wet etchant lateral diffusion to avoid a bird's beak gate stacked profile. It should further be noted that under the conditions described herein, the etchant of the present embodiment selectively etches the high-k dielectric but does not attack other $SiO_2$-based oxide layers or the Si surface of semiconductor body 10.

In alternative embodiments of the present invention, other etchants may be used to etch the high-k dielectric. For example, hot SC1 can remove annealed and unannealed high-k films at an etch rate of between about 1 and 2 nm per minute. In this alternative embodiment of the present invention, the SC1 is made of, in part by volume about 1 part $NH_4OH$, between about 1 and 2 parts $H_2O_2$, and between about 5 and 7 parts $H_2O$, at a temperature of between about 30° C. and about 90° C., preferably about 65° C. Again, since hot SC1 does not attack $SiO_2$ and Si, liner 30 can protect the sidewalls of the gate stacks of devices 1000, 2000 and 3000.

In a further alternative embodiment, piranha can be used to remove portions of high-k dielectric 1027. Piranha is made from between about 60% and 70% $H_2SO_4$, between about 30% and 40% $H_2O_2$, and $H_2O$, at room temperature, preferably about 25° C. Again, since piranha does not attack $SiO_2$ and Si, liner 30 can be used to protect the sidewalls of the gate stacks of devices 1000, 2000 and 3000.

Once the high-k dielectric has been etched using either the preferred or alternative embodiment processes described hereinabove, a standard industry-based diluted HF wet clean according to conventional techniques is applied to remove oxide liner 30. Hard mask 28 may be thinned as well during this process. Finally, a litho pattern is applied to open FGM device 1000 and HVM device 2000, while keeping device 3000 blocked. A second poly RIE is performed to remove layer 1025 with high oxide selectivity to stop on layer 1024a of device 1000 and layer 1024b of device 2000, as shown in FIG. 2e. In preferred embodiments of the present invention, this is a similar or identical RIE process that was used to remove second conducting layer 26, as shown in FIG. 2b.

Turning to FIG. 2e, hard mask 28 and CVD oxide 30 is removed using conventional techniques such as a diluted HF wet clean. It can be seen in regions 32 of FIG. 2e that portions of high-k material 1027 are wider or overhang in the stacked gate profile in between second conductive regions 26 and first conducting region 1025. The reason for these wider high-k material regions is a byproduct from a combination the deposition of liner oxide 30 with a mixture of wet removal of high-k layer 1027 and subsequent wet removal of liner oxide 30. In preferred embodiments of the present invention, the difference in width is between about 2 nm and 10 nm, typically about 5 nm. In alternative embodiments of the present invention, however, these width differences may be more pronounced or not present.

Further processing continues as in a typical integrated chip manufacturing process. For example, spacers, source, and drain regions are formed followed by metallization. The devices after front end processing are shown in FIG. 1.

Turning to FIG. 3, a process flow chart 300 describing the process disclosed hereinabove is illustrated. Prior to step 302, a process of record is used, for example, to form isolation trenches and STI regions on a silicon wafer. In step 302, a memory gate dielectric, preferably a tunneling oxide if a non-volatile memory device is being fabricated, is deposited on the wafer using conventional techniques. A conducting material, such as polysilicon, is deposited over the memory gate dielectric in step 304, and an inter-poly dielectric, preferably a high-k dielectric, is then deposited over the first conducting material in step 306.

In step 308, the logic gate dielectric is deposited for standard logic devices such as those described in FIG. 1c; and in step 310, the second conducting material, preferably polysilicon, is deposited over the inter-poly dielectric of the non-volatile cells and over the logic gate of the standard logic devices.

In step 312, the second conducting material is patterned and etched for non-volatile devices so that the high-k dielectric of the non-volatile devices is exposed. Alternatively, if high-k dielectric materials are being used for standard logic devices, the second conducting material may be etched to expose the high-k dielectric material in the vicinity of the standard logic devices, also.

Once the high-k dielectric is exposed, in step 314, a CVD oxide is disposed on the surface of the semiconductor wafer so that at least gate stack sidewalls are covered with preferably at least 20 nm of Oxide. This oxide is used to protect the gate stack sidewalls from being damaged during the subsequent etching step. In step 314, the CVD oxide is ansiotropically etched, preferably using a reactive ion etch, so that at least the top surface of the high-k dielectric material is exposed, and the sidewalls of the gate stacks, including sidewalls of the first and second conductive materials remain protected with the CVD oxide.

In step 318, the exposed high-k dielectric is removed using a wet etch using hot phos, piranha or SC1 as described hereinabove. Finally, the hard mask and CVD oxide liner is removed. Processing continues according to standard techniques until the wafer is fully fabricated. For example, spacers, source, and drain regions are formed followed by interconnect metallization.

An alternative embodiment will now be described with reference to the cross-sectional diagrams of FIGS. 4a-4c and the flow diagram of FIG. 5. In this embodiment of the present invention, a method for forming a patterned capacitor comprises a first conducting material, an insulator over the first second conducting material and finally a second conducting material over the insulator. The capacitor may be part of a metal insulator metal capacitor, a metal insulator semiconductor capacitor, a semiconductor insulator semiconductor capacitor, or a field effect transistor.

According to an embodiment of the present invention shown in FIG. 4a, a first conductive material 12 forms the bottom electrode of the capacitor. The first conducting material 12 may either be a metal, silicon or a poly silicon material, or a region of the semiconductor body. An insulator 24 is deposited on the first conducting material 12. The insulator is preferably a high-k dielectric material such as $Al_2O_3$, although other high-k dielectrics such as those mentioned hereinabove may be used. A second conducting material 26, such as polysilicon is deposited on the insulator 24. The structure is patterned using conventional lithography steps to open areas for etch.

A two step RIE process including a break through etch and a main etch is used to form the patterned capacitor structure. After the break through step to remove any oxide layer, the main RIE etch anisotropically etches the conducting material 26 to form part of the top electrode as shown in FIG. 4b. High-k dielectric layer 24, can then be wet etched using hot phos, piranha, or SC1 as described hereinabove with respect to other embodiments of the present invention.

Turning to FIG. 5, a process flowchart 500 describing the formation of the capacitor structure of FIGS. 4a-4b is shown. A high-k insulator is deposited on the semiconductor body in step 502, and a conducting material is deposited on the high-k insulator in step 504. In step 506, a portion of the conducting material, preferably a portion that will be removed to form a boundary around a capacitor structure, is exposed using standard lithography techniques, and in step 508, an RIE etch is used to remove the portion of the exposed conducting material. In step 510, high-k insulation at the boundaries of the capacitor structure is removed according to the wet etch techniques described hereinabove using hot phos, piranha, or SC1.

Figure 6A:
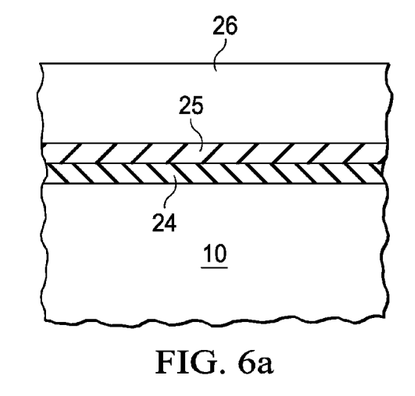
FIGS. 6a-6c illustrate a cross sections of gate stacks fabricated according to an embodiment process.
Figure 6B:
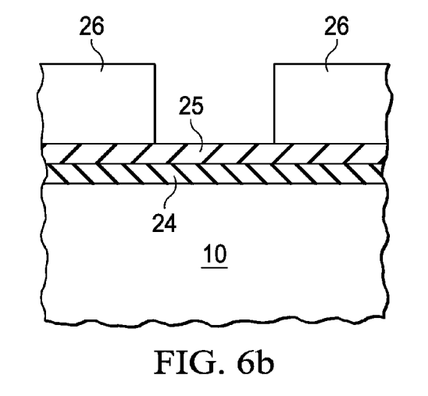
Figure 6C:
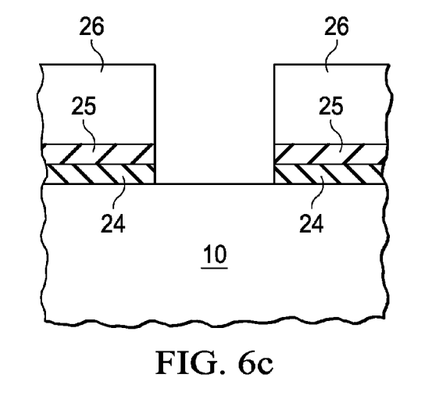

Yet another embodiment of the present invention is illustrated in FIGS. 6a-6c, which is method for selectively patterning a gate stack for a field effect transistor or metal insulator semiconductor capacitor that has a conducting material 26, a first dielectric layer 24 and a second dielectric layer 25 as shown in FIG. 6a. In this embodiment of the present invention, second dielectric layer 25 is a gate dielectric, such as those described hereinabove, that can be easily removed by a reactive ion etch. First dielectric layer 24 is a high-k material such as $Al_2O_3$ or others as described hereinabove. After the conducting material 26 is removed by a reactive ion etch, as shown in FIG. 6b, the reactive ion etch continues with perhaps a second etch chemistry to remove the second insulator layer 25. A wet etch using hot phos, piranha, or SC1 followed by a wet clean, as described hereinabove, is then used to remove the high-k dielectric layer.

Figure 7:
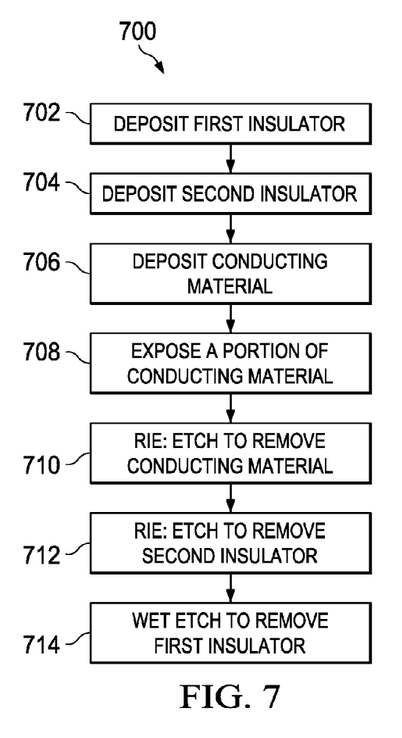
FIG. 7 illustrates a flow diagram for fabricating gate stacks according to an embodiment process.

Turning to FIG. 7, a process flowchart 700 describing the formation of the gate stack structure of FIGS. 6a-6c is shown. A first insulator, preferably high-k insulator is deposited on the semiconductor body in step 702, followed by a second insulator, deposited on the high-k insulator in step 704. In step 706, a conducting layer, such as polysilicon is deposited over a portion of the second insulator, and in step 708, a portion of the conducting layer to be etched away is exposed using standard lithographic techniques. In step 710, an RIE etch is used to remove the portion of the exposed conducting material, and in step 712 an RIE etch is used to remove the second insulator. Finally, in step 714, a portion of the first, high-k insulator is removed using the wet etch techniques described hereinabove, namely, performing a wet etch using hot phos, piranha, or SC1. It should be noted that the steps which require the RIE could be alternatively performed using other techniques.

It will also be readily understood by those skilled in the art that materials and methods may be varied while remaining within the scope of the present invention. It is also appreciated that the present invention provides many applicable inventive concepts other than the specific contexts used to illustrate preferred embodiments. Accordingly, the appended claims are intended to include within their scope such processes, machines, manufacture, compositions of matter, means, methods, or steps.

What is claimed is:

1. A method of forming a semiconductor device, the method comprising:
   depositing a high-k dielectric over a semiconductor body, the high-k dielectric contacting a top surface of the semiconductor body; and
   wet etching the high-k dielectric using an etchant selected from the group consisting of hot phos, piranha, and SC1, wherein the high-k dielectric is not damaged prior to the wet etching, and wherein the etchant selected from the group consisting of hot phos, piranha, and SC1 is selective to the high-k dielectric relative to the semiconductor body.

2. The method of claim 1, further comprising:
   depositing a conducting material over the high-k dielectric; and
   depositing an oxide liner on sidewalls of the conducting material prior to the wet etching the high-k dielectric, wherein the oxide liner protects the sidewalls from the etchant.

3. The method of claim 2, wherein the etchant comprises hot phos.

4. The method of claim 3, wherein the hot phos comprises a temperature of between about 100° C. and about 200° C.

5. The method of claim 3, wherein the etchant comprises $H_2O$ and between about 50% and about 90% $H_3PO_4$.

6. The method of claim 3, wherein the depositing the oxide liner comprises:
   depositing a CVD oxide liner over the conducting material and the high-k dielectric; and
   etching the oxide liner using an anisotropic reactive ion etch, wherein the sidewalls of the conducting material remain covered with the oxide liner and a surface of the high-k dielectric is exposed.

7. The method of claim 6, wherein the liner comprises a thickness of between about 2 nm and about 10 nm.

8. The method of claim 3, wherein:
   the high-k dielectric comprises $Al_2O_3$; and
   the conducting material comprises polysilicon.

9. The method of claim 2, wherein the etchant comprises SC1.

10. The method of claim 9, wherein the SC1 comprises a temperature of between about 30° C. and about 90° C.

11. The method of claim 9, wherein the etchant comprises about 1 part $NH_4OH$, between about 1 part and 2 parts $H_2O_2$, and between about 5 parts and 7 parts $H_2O$.

12. The method of claim 9, wherein the depositing the oxide liner comprises:
   depositing a CVD oxide liner over the conducting material and the high-k dielectric; and
   etching the oxide liner using an anisotropic reactive ion etch, wherein the sidewalls of the conducting material remain covered with the oxide liner and a surface of the high-k dielectric is exposed.

13. The method of claim 12, wherein the oxide liner comprises a thickness of between 2 nm and 10 nm.

14. The method of claim 9, wherein:
   the high-k dielectric comprises $Al_2O_3$; and
   the conducting material comprises polysilicon.

15. The method of claim 2, wherein the etchant comprises piranha.

16. The method of claim 15, wherein the depositing the oxide liner comprises:
   depositing a CVD oxide liner over the conducting material and the high-k dielectric; and
   etching the oxide liner using an anisotropic reactive ion etch, wherein the sidewalls of the conducting material remain covered with the oxide liner and a surface of the high-k dielectric is exposed.

17. The method of claim 15, wherein:
   the high-k dielectric comprises $Al_2O_3$; and
   the conducting material comprises polysilicon.

18. The method of claim 15, wherein the piranha comprises $H_2O$, between about 60% and 70% $H_2SO_4$, and between about 30% and 40% $H_2O_2$.

19. The method of claim 15, wherein the wet etching is performed at room temperature.

20. The method of claim 1, wherein the hot phos comprises $H_2O$ and between about 50% and about 90% $H_3PO_4$, wherein the piranha comprises $H_2O$, between about 60% and 70% $H_2SO_4$, and between about 30% and 40% $H_2O_2$, and wherein the SC1 comprises about 1 part $NH_4OH$, between about 1 part and 2 parts $H_2O_2$, and between about 5 parts and 7 parts $H_2O$.

21. A method of forming a semiconductor device comprising:
    depositing a high-k dielectric over a semiconductor body, the high-k dielectric contacting a top surface of the semiconductor body;
    depositing a conducting material over the high-k dielectric;
    depositing a liner over the conducting material and the high-k dielectric;
    etching the liner using an anisotropic reactive ion etch, wherein sidewalls of the conducting material remain covered with the liner and a surface of the high-k dielectric is exposed; and
    etching the high-k dielectric using an etchant selected from the group consisting of hot phos, piranha, and SC1, wherein the high-k dielectric is not damaged prior to etching using the etchant, and wherein the etchant selected from the group consisting of hot phos, piranha, and SC1 is selective to the high-k dielectric relative to the semiconductor body.

22. The method of claim 21, wherein the liner comprises a CVD oxide.

23. The method of claim 21, further comprising forming a transistor.

24. The method of claim 23, wherein the conducting material comprises a polysilicon gate of the transistor and the high-k dielectric comprises a gate dielectric of the transistor.

25. The method of claim 21, further comprising forming a capacitor.

26. The method of claim 25, wherein the high-k dielectric comprises a dielectric of the capacitor and the conducting material comprises a plate of the capacitor.

27. The method of claim 21, wherein the etchant comprises hot phos.

28. The method of claim 27, wherein the etchant comprises a temperature of between about 100° C. and about 200° C., and wherein the etchant comprises $H_2O$ and between about 50% and about 90% $H_3PO_4$.

29. The method of claim 21, wherein the etchant comprises SC1.

30. The method of claim 29, wherein the etchant comprises a temperature of between about 30° C. and about 90° C., and wherein the etchant comprises about 1 part $NH_4OH$, between about 1 part and 2 parts $H_2O_2$, and between about 5parts and 7 parts $H_2O$.

31. The method of claim 21, wherein the etchant comprises piranha.

32. The method of claim 31, wherein the etchant comprises $H_2O$, between about 60% and 70% $H_2SO_4$, and between about 30% and 40% $H_2O_2$.

33. The method of claim 21, wherein the hot phos comprises $H_2O$ and between about 50% and about 90% $H_3PO_4$, wherein the hot phos comprises a temperature of between about 100° C. and about 200° C., wherein the piranha comprises $H_2O$, between about 60% and 70% $H_2SO_4$, and between about 30% and 40% $H_2O_2$, wherein the SC1 comprises about 1 part $NH_4OH$, between about 1 part and 2 parts $H_2O_2$, and between about 5 parts and 7 parts $H_2O$, wherein the SC1 comprises a temperature of between about 30° C. and about 90° C.

34. A method for fabricating a semiconductor circuit, the method comprising;
    forming a first dielectric over a semiconductor body;
    forming a first conducting material over the first dielectric;
    forming a second dielectric over the first conducting material, the second dielectric contacting a top surface of the first conducting material, wherein the second dielectric comprises a high-k material;
    forming a second conducting material over the second dielectric;
    etching a portion of the second conducting material, wherein a portion of the second dielectric becomes exposed;
    forming a liner over sidewalls of the second conducting material; and
    wet etching the second dielectric using a etchant selected from the group consisting of hot phos, piranha, and SC1, wherein the second dielectric is not damaged prior to the wet etching, and wherein the etchant selected from the group consisting of hot phos, piranha, and SC1 is selective to the second dielectric relative to the semiconductor body.

35. The method of claim 34, wherein forming the liner over the sidewalls comprises:
    forming a CVD oxide over the second conducting material and the exposed second dielectric; and
    removing the CVD oxide from a surface of the second dielectric, wherein the liner remains disposed on the sidewalls of the second conducting material.

36. The method of claim 35, wherein the removing the CVD oxide from the surface of the second dielectric comprises an anisotropic reactive ion etch.

37. The method of claim 34, wherein the second dielectric comprises the high-k dielectric comprises $Al_2O_3$, and wherein the second conducting material comprises polysilicon.

38. The method of claim 34, wherein the etchant comprises hot phos.

39. The method of claim 38, wherein the etchant comprises a temperature of between about 100° C. and about 200° C., and wherein the etchant comprises $H_2O$ and between about 50% and about 90% $H_3PO_4$.

40. The method of claim 34, wherein the etchant comprises SC1.

41. The method of claim 40, wherein the etchant comprises a temperature of between about 30° C. and about 90° C., and wherein the etchant comprises about 1 part $NH_4OH$, between about 1 part and 2 parts $H_2O_2$, and between about 5 parts and 7 parts $H_2O$.

42. The method of claim 34, wherein the etchant comprises piranha.

43. The method of claim 42, wherein the etchant comprises $H_2O$, between about 60% and 70% $H_2SO_4$, and between about 30% and 40% $H_2O_2$.

44. The method of claim 34, wherein the hot phos comprises $H_2O$ and between about 50% and about 90% $H_3PO_4$, wherein the hot phos comprises a temperature of between about 100° C. and about 200° C., wherein the piranha comprises $H_2O$, between about 60% and 70% $H_2SO_4$, and between about 30% and 40% $H_2O_2$, wherein the SC1 comprises about 1 part $NH_4OH$, between about 1 part and 2 parts $H_2O_2$, and between about 5 parts and 7 parts $H_2O$, and wherein the SC1 comprises a temperature of between about 30° C. and about 90° C.

45. A method of forming a semiconductor device, the method comprising:
    depositing a high-k dielectric over a semiconductor body, the high-k dielectric contacting a top surface of the semiconductor body; and wet etching the high-k dielectric using an etchant comprising about 1 part $NH_4OH$, between about 1 part and 2 parts $H_2O_2$, and between about 5 parts and 7 parts $H_2O$, wherein the high-k dielectric is not damaged prior to the wet etching, and wherein, during the wet etching, the etchant is selective to the high-k dielectric relative to the semiconductor body.

46. The method of claim 45, further comprising:
depositing a conducting material over the high-k dielectric; and
depositing an oxide liner on sidewalls of the conducting material prior to the wet etching the high-k dielectric, wherein the oxide liner protects the sidewalls from the etchant.

47. The method of claim 46, where the high-k dielectric is $Al_2O_3$, and the conducting material comprises polysilicon.

48. The method of claim 47, wherein the etchant comprises a temperature of between about 100° C. and about 200° C.

49. The method of claim 45, wherein the etchant comprises a temperature of between about 30° C. and about 90° C.

50. A method of forming a semiconductor device, the method comprising:
depositing a high-k dielectric over a semiconductor body, the high-k dielectric contacting a top surface of the semiconductor body; and
wet etching the high-k dielectric using an etchant comprising $H_2O$ and between about 50% and about 90% $H_3PO_4$, wherein the high-k dielectric is not damaged prior to the wet etching, and wherein, during the wet etching, the etchant is selective to the high-k dielectric relative to the semiconductor body.

51. The method of claim 50, further comprising:
depositing a conducting material over the high-k dielectric; and
depositing an oxide liner on sidewalls of the conducting material prior to the wet etching the high-k dielectric, wherein the oxide liner protects the sidewalls from the etchant.

52. The method of claim 51, where the high-k dielectric is $Al_2O_3$, and the conducting material comprises polysilicon.

* * * * *